US006676137B2

(12) United States Patent
Dean

(10) Patent No.: US 6,676,137 B2
(45) Date of Patent: Jan. 13, 2004

(54) SNAP-ON EMI GASKET CLIP AND METHOD OF SEALING A COMPUTER CHASSIS FROM EMI

(75) Inventor: Ronald Paul Dean, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/085,678

(22) Filed: Feb. 27, 2002

(65) Prior Publication Data
US 2003/0160396 A1 Aug. 28, 2003

(51) Int. Cl.[7] .......................... F16J 15/02; B60G 11/02; F16B 37/02
(52) U.S. Cl. .................. 277/628; 277/630; 277/649; 277/920; 174/35 GC; 267/36.1; 411/174
(58) Field of Search ................. 277/628, 630, 277/637, 640, 648, 649, 650, 653, 920; 174/35 GC, 35 MS, 17 CT; 267/36.1, 41, 47, 160, 164–165; 411/174, 175, 163, 164, 165, 160, 162

(56) References Cited

U.S. PATENT DOCUMENTS

| 4,762,966 A | * | 8/1988 | Kosanda ................. 174/35 GC |
| 5,029,254 A | * | 7/1991 | Stickney ................. 174/35 GC |
| 5,223,670 A | * | 6/1993 | Hogan et al. ........... 174/35 MS |
| 5,233,507 A | * | 8/1993 | Gunther et al. ............. 361/818 |
| 5,576,513 A | * | 11/1996 | Gunther et al. ........... 174/35 R |
| 5,917,147 A | * | 6/1999 | Lewis ..................... 174/35 GC |
| 6,120,304 A | * | 9/2000 | Harwood et al. ............. 439/92 |
| 6,135,815 A |   | 10/2000 | Ko et al. ..................... 439/607 |
| 6,227,910 B1 |   | 5/2001 | Huang ......................... 439/610 |
| 6,267,629 B1 | * | 7/2001 | Nguyen et al. ............. 439/857 |
| 6,320,120 B1 | * | 11/2001 | Van Haaster .......... 174/35 GC |

FOREIGN PATENT DOCUMENTS

FR 2571922 A1 * 4/1986 ............ H05K/9/00

OTHER PUBLICATIONS

"EMC Introduction" [online] [retrieved on Nov. 26, 2001] Retrieved from: http://www.enme.umd./EMCPL/subpage/emc–intro.htm. pp.1–4.
"Instrument Specialties Catalog," [online] [Retrieved on Jun. 14, 2001] Retrieved from http://www.instr.com. pp. 1–6, 70–73.

* cited by examiner

Primary Examiner—Anthony Knight
Assistant Examiner—Vishal Patel

(57) ABSTRACT

In one embodiment, the present invention is directed to a system for shielding electromagnetic energy. The system comprises an electromagnetic interference (EMI) gasket comprising at least one longitudinal member that is operable to exert a spring force upon deflection and at least one lance member; and a chassis comprising a lip member, the lip member being operable to accept the EMI gasket, a base member that is operable to deflect the at least one longitudinal member when the EMI gasket is placed over the lip member, and a locking member that is adapted to latch the at least one lance member in a latched position when the EMI gasket is placed over the lip member, wherein the spring force is operable to retain the at least one lance member in the latched position and the spring force is operable to facilitate electrical contact between the base member and the EMI gasket.

10 Claims, 3 Drawing Sheets

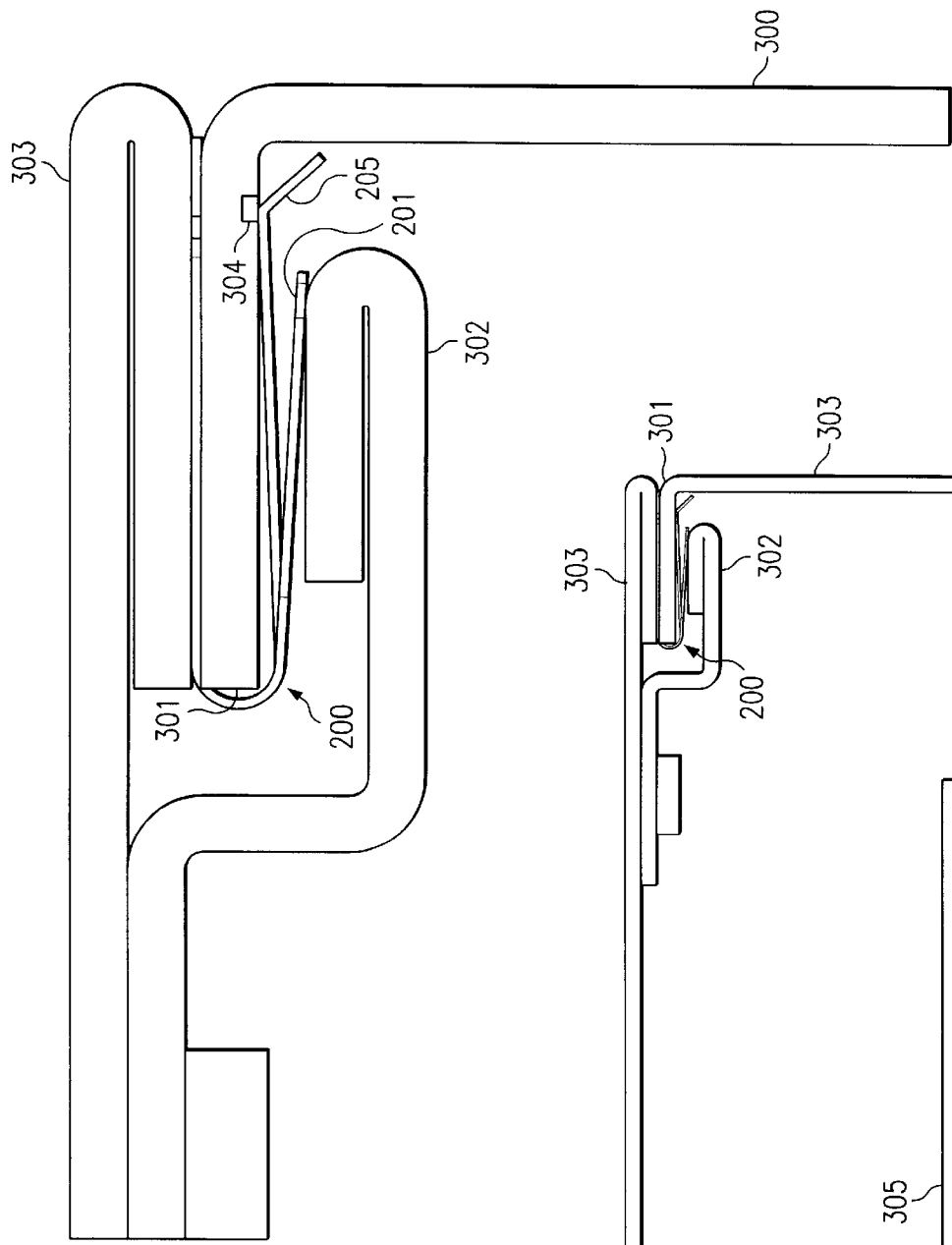

SNAP-ON EMI GASKET CLIP AND METHOD OF SEALING A COMPUTER CHASSIS FROM EMI

TECHNICAL FIELD

The present invention is related to electromagnetic shielding and more particularly to shielding electromagnetic interference (EMI) with an EMI gasket.

BACKGROUND OF THE INVENTION

Electromagnetic inference (EMI) is related to the introduction of unacceptable amounts of electromagnetic energy into an environment by electrical devices and equipment. For example, a desk top or lap top computer chassis may comprise a large plurality of micro-electronic components that perform various tasks. Electromagnetic energy is radiated due to the electrical switching operations of the components. Accordingly, the radiated electromagnetic energy may significantly degrade the performance of other devices, if the radiated electromagnetic energy is permitted to be introduced into a common environment.

EMI is physically related to the transmission and reception of electromagnetic energy. Specifically, a source (alternatively referred to as an emitter herein) generates electromagnetic energy. The electromagnetic energy is radiated to a receiver (alternatively referred to as a receptor herein). The radiation of the electromagnetic energy to the receiver may cause the receiver to act in an undesired and often unpredictable manner.

EMI shielding is often utilized to reduce or eliminate the effects of EMI. Such shielding involves placement of an electromagnetic shield or EMI shield between an EMI source and potential EMI receivers. The electromagnetic shield may be a continuous metal sheet. The electromagnetic shield may adopt alternative forms such as a perforated metal sheet to permit thermal radiation. The electromagnetic energy emitted by a source propagates as an electromagnetic wave. The electromagnetic wave is partially absorbed by the EMI shield. Accordingly, the intensity of the electromagnetic wave is attenuated or reduced and the EMI effects upon receivers are lessened.

The design of the electromagnetic shield significantly impacts its effectiveness in reducing the intensity of the electromagnetic wave associated with the EMI. Specifically, a gap or seam in an electromagnetic shield will cause EMI leakage. Accordingly, EMI gaskets are utilized to prevent gaps or seams from causing EMI leakage. EMI gaskets are conductive media designed to provide a flexible connection between two electrical conductors that are being used as EMI shields. EMI gaskets are selectively placed to reduce any slots, seams, or other discontinuities between the EMI shields to prevent EMI leakage.

An important characteristic of EMI gaskets is their ability to facilitate acceptable electrical contact between the two conductors. Typically, EMI gaskets are compressed to provide a sufficient contact force between the EMI gaskets and the respective conductive surfaces. The contact force increases the electrical contact between the two conductors via the EMI gasket. However, typical devices that utilize an external or closure force to facilitate the electrical contact have several disadvantages. First, application of an external force to typical EMI gaskets is problematic because the tolerance associated with this approach is quite small. Deviation from the appropriate compression force may either allow EMI leakage or damage the EMI gasket.

Additionally, EMI gaskets typically provide a spring force for positioning purposes. As depicted in FIG. 1, known system 100 includes EMI gasket 103 that utilizes a spring force. When points A and B of EMI gasket 103 are displaced from their equilibrium position, a spring force is encountered due to the structural rigidity of EMI gasket 103. EMI gasket 103 is placed on conductive medium 102 that is typically a part of a chassis of system 100. EMI gasket 103 is opened during placement on conductive medium 102, i.e., the distance between points A and B is increased. A spring force is encountered that impinges EMI gasket 103 on conductive medium 102 at points A and B. Accordingly, the spring force tends to keep EMI gasket 103 from being displaced.

EMI gasket 103 is compressed between conductive medium 101 (e.g., a chassis cover) and conductive medium 102. This increases the contact forces associated with points A and C of gasket 103. However, the compression deforms EMI gasket 103. The deformation causes a deformation force at point B. The deformation force opposes the spring force thereby reducing the effectiveness of the spring force to hold EMI gasket 103 in its desired position.

Other various mechanisms may be utilized to lock the EMI gaskets in place to facilitate the electrical contact. For example, corresponding holes, flanges, and locking bolts may be utilized to lock EMI gaskets in a desired position. However, locking EMI gaskets in this manner requires some amount of manual configuration upon assembly. Additionally, removal of the EMI gaskets to access shielded electronic components requires additional manual manipulation.

BRIEF SUMMARY OF THE INVENTION

In one embodiment, the present invention is directed to a system for shielding electromagnetic energy. The system comprises an electromagnetic interference (EMI) gasket comprising at least one longitudinal member that is operable to exert a spring force upon deflection and at least one lance member; and a chassis comprising a lip member, the lip member being operable to accept the EMI gasket, a base member that is operable to deflect the at least one longitudinal member when the EMI gasket is placed over the lip member, and a locking member that is adapted to latch the at least one lance member in a latched position when the EMI gasket is placed over the lip member, wherein the spring force is operable to retain the at least one lance member in the latched position and the spring force is operable to facilitate electrical contact between the base member and the EMI gasket.

BRIEF DESCRIPTION OF THE DRAWINGS

FIG. 3A depicts an EMI gasket placed on a chassis according to embodiments of the present invention.

FIG. 3B depicts a cut-away view of the EMI gasket placed on the chassis as shown in FIG. 3A according to embodiments of the present invention.

DETAILED DESCRIPTION OF THE INVENTION

Figure 1:
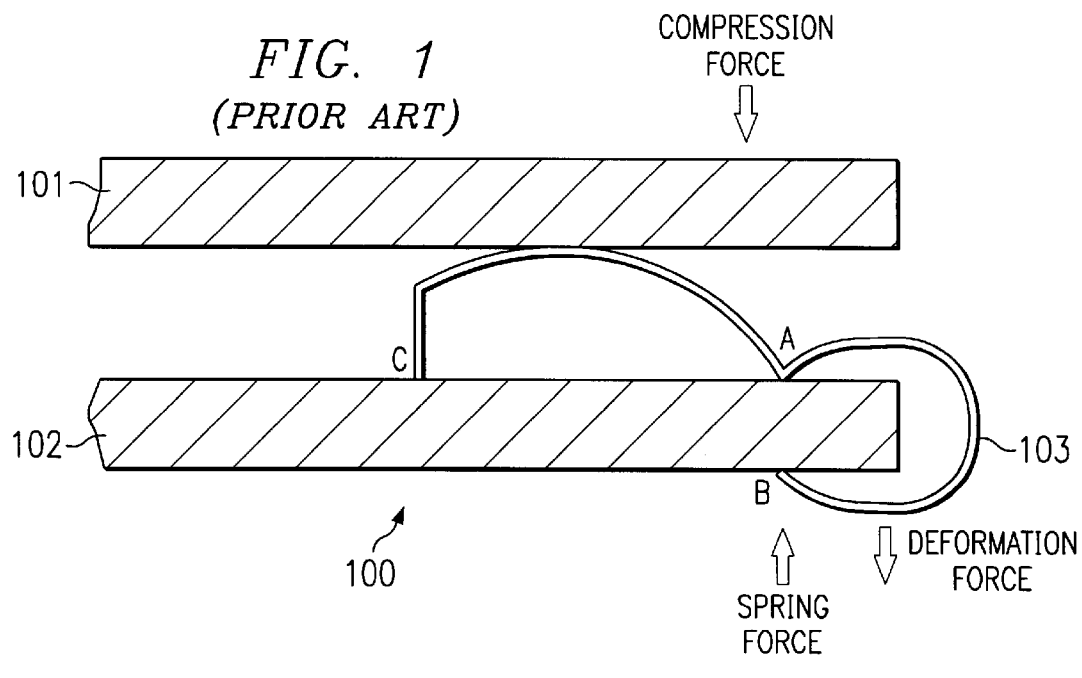
FIG. 1 depicts a system that includes an electromagnetic interference (EMI) gasket according to the prior art.
Figure 2A:
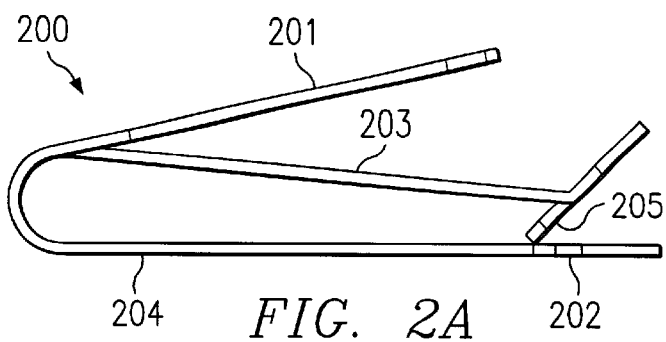
FIG. 2A depicts a side view of an exemplary EMI gasket according to embodiments of the present invention.

Referring now to the drawings, FIG. 2A depicts a side view of exemplary EMI gasket 200 according to embodiments of the present invention. EMI gasket 200 may comprise one or a plurality of longitudinal members 201. Longitudinal members 201 are operable to exert a spring force when deflected. Preferably, the spring force is approximately proportional to the amount of deflection of longitudinal members 201 from their equilibrium position. EMI gasket 200 comprises frame members 203 and 204. Frame members 203 and 204 are mechanically coupled and are adapted to accept a portion of a chassis as will be discussed in greater detail below. EMI gasket 200 further comprises one or several lance members 205. Lance members 205 are preferably operable to latch EMI gasket 200 in place when EMI gasket 200 is engaged with a chassis. Lance members 205 may be implemented to possess a barb if desired to facilitate latching of EMI gasket 200.

EMI gasket 200 further comprises access hole 202. Access hole 202 may be utilized to unlatch EMI gasket 200 from a latched position. Specifically, a wire or other suitable tool may be inserted through access hole 202 to displace frame member 203. By exerting force on frame member 203, EMI gasket 200 may be temporarily deformed to remove lance members 205 from a latched position without damaging EMI gasket 200.

Figure 2B:
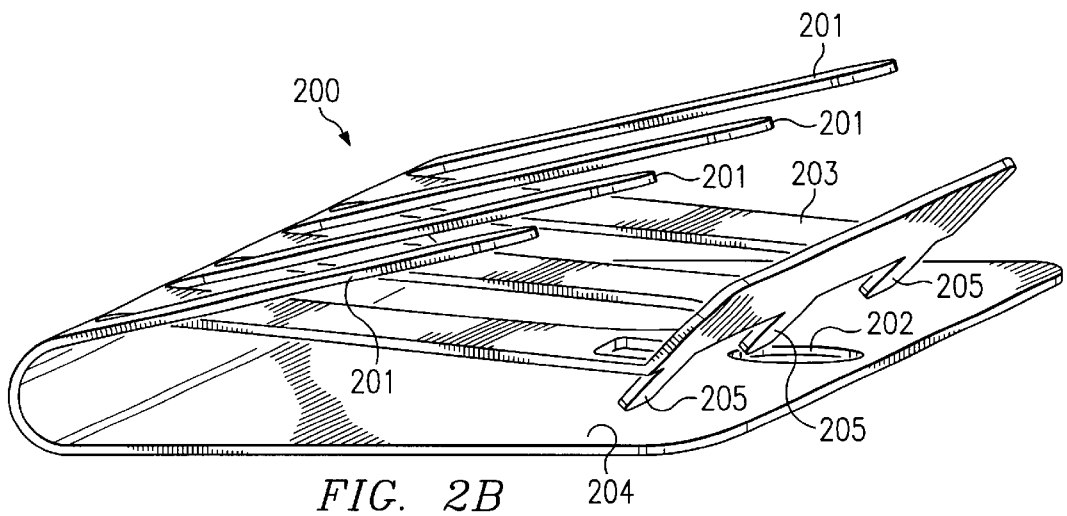
FIGS. 2B and 2C depict isometric views of the EMI gasket depicted in FIG. 2A according to embodiments of the present invention.
Figure 2C:
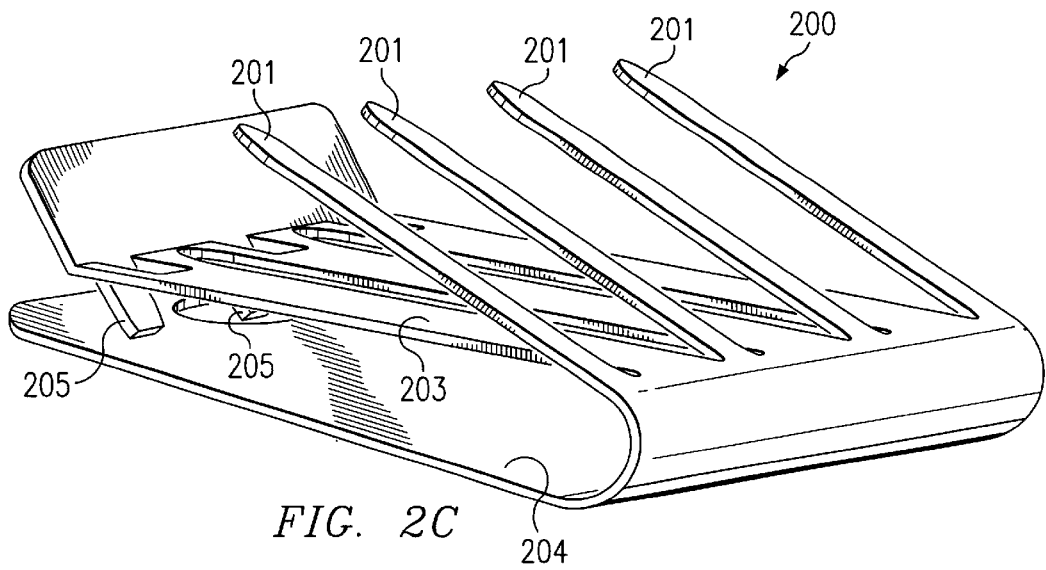

FIGS. 2B and 2C depict isometric views of EMI gasket 200 according to embodiments of the present invention. Additionally, longitudinal members 201, hole 202, frame members 203 and 204, and lance members 205 are preferably adapted to possess suitable dimensions for mechanical and electrical coupling to a suitable chassis structure. Persons of ordinary skill in the art may modify any dimensions of the elements of EMI gasket 201 to implement a desired application according to the present invention.

FIG. 3A depicts EMI gasket 200 placed on exemplary chassis 300 according to embodiments of the present invention. Chassis 300 includes lip member 301, base member 302, and cover 303. Lip member 301 and base member 302 are preferably approximately parallel to each other and are fixed at a predetermined distance to thereby accept lip member 301. The predetermined distance is preferably less than the width of EMI gasket 200. Also, frame members 203 and 204 are adapted to accept lip member 301.

When EMI gasket 200 is placed over lip member 301, longitudinal members 201 are deflected by base member 302 (which may be implemented as being attached to or part of cover 303) such that longitudinal members 201 become approximately parallel to frame member 204. The deflection of longitudinal members 201 causes the exertion of a spring force. The exertion of the spring force facilitates electrical contact between EMI gasket 200 and base member 302. Moreover, the exertion of the spring force facilitates electrical contact between lip member 302 and EMI gasket 200. Accordingly, EMI gasket 200 provides an EMI seal to prevent emission of electromagnetic energy into an environment by electronic components 305 that are operated inside of chassis 300.

It shall be appreciated that the use of lip member 301 and base member 302 to deflect longitudinal members 201 is advantageous as compared to the known method of supplying a compression force via cover 303. In contrast, by employing embodiments of the present invention, the amount of the spring force is controlled to a relatively high degree. The amount of the spring force is not defined by how a user positions cover 303. Specifically, the amount of the spring force is defined by the separation distance between lip member 301 and base member 302 relative to the dimensions of EMI gasket 200. Accordingly, the configuration of chassis 300 ensures that sufficient force is exerted to provide sufficient electrical contact to provide the desired EMI seal. However, the force is not so great as to damage EMI gasket 200. Moreover, it shall be appreciated that lip member 301 greatly reduces the probability of damaging EMI gasket 200. Specifically, lip member 301 is surrounded by and substantially parallel to frame members 203 and 204. Accordingly, longitudinal members 201 cannot be deflected beyond frame member 204 thereby preventing permanent deformation of EMI gasket 200.

FIG. 3B depicts a cut-away view of the EMI gasket 200 placed on chassis 300 as shown in FIG. 3A according to embodiments of the present invention. In FIG. 3B, chassis 300 is shown to include locking member 304. Locking member 304 may be implemented by machining a hole or detent into lip member 301. As previously noted, frame member 203 may comprises one or several lance members 205 at its end Chassis 300 may comprise a number of locking members 304 that equals the number of lance members 205 of EMI gasket 200. It shall be appreciated that the depicted dimensions of locking member 304 and lance member 205 are exaggerated for the convenience of the reader. Since longitudinal member 201 is deflected, the spring force exerted by EMI gasket 200 is directed toward base member 301. The spring force causes lance members 205 of frame member 203 to latch in or to engage with a respective locking member 304 when EMI gasket 200 is inserted over lip member 301. Thus, the spring force is operable to both facilitate the desired electrical contact for EMI shielding and to hold EMI gasket 200 in its desired position.

Accordingly, embodiments of the present invention are quite advantageous as compared to typical EMI gasket arrangements where the compression force used to facilitate electrical contact opposes the spring force used to hold typical EMI gaskets in place. It shall be appreciated that this characteristic is quite advantageous for systems that experience vibrations. For example, a typical computer chassis encloses a fan unit to cool various electronic components. The fan unit may cause the chassis to vibrate and may result in displacement of a typical EMI gasket thereby degrading its EMI seal.

Embodiments of the present invention may be utilized for any number of devices. For example, embodiments of the present invention may be utilized to provide EMI shielding for a computer chassis, a disk drive casing, a printer enclosure, a radio enclosure, and/or the like. In fact, embodiments of the present invention may be utilized to provide EMI shielding for any type of device that produces electromagnetic interference and is capable of being implemented inside a suitable chassis.

What is claimed is:

1. A system for shielding electromagnetic energy, said system comprising:
   (i) a chassis that comprises:
      a cover;
      a base member that is positioned parallel to said cover at a fixed distance; and
      a lip member inserted between said cover and said base member, wherein said lip member includes a locking member; and
   (ii) an electromagnetic interference (EMI) gasket that comprises:
      frame members that surround said lip member;
      a lance member; and
      at least one longitudinal member, wherein when said lip member is inserted between said cover and said base member, said longitudinal member exerts a spring force by deflection of said longitudinal member thereby providing electrical contact between said base member and said lip member, wherein said spring force retains said lance member in said locking member.

2. The system of claim 1 wherein said lance member includes a barb.

3. The system of claim 1 wherein said EMI gasket further comprises an access hole that enables contact of said frame member to release said lance member from said locking member.

4. The system of claim 1 further comprising:

electronic components, disposed within said chassis, that generate EMI.

5. The system of claim 4 further comprising:

a fan unit that cools said electronic components and that causes said chassis to experience vibrations.

6. A method for facilitating electromagnetic energy shielding, said method comprising:

providing a chassis that includes a cover, a base member that is positioned parallel to said cover at a fixed distance, and a lip member that is adapted to be inserted between said cover and said base member, wherein said lip member includes a locking member;

placing an electromagnetic interference (EMI) gasket on said lip member wherein said EMI gasket includes frame members that surround said lip member, a lance member, and at least one longitudinal member; and positioning said lip member between said cover and base member, wherein said longitudinal member exerts a spring force by deflection of said longitudinal member by said base member, to provide electrical contact between said base member and said lip, and wherein said spring force retains said lance member in said locking member.

7. The method of claim 6 wherein said lance member includes a barb.

8. The method of claim 6 wherein said EMI gasket further comprises an access hole that enables contact of said frame member to release said lance member from said locking member.

9. The method claim 6 further comprising:

operating electronic components, disposed within said chassis, that generate EMI.

10. The method of claim 9 further comprising:

operating a fan unit that cools said electronic components and that causes said chassis to experience vibrations.

* * * * *